(12) United States Patent
Koh

(10) Patent No.: US 6,624,508 B2
(45) Date of Patent: Sep. 23, 2003

(54) HIGH FREQUENCY, LOW COST PACKAGE FOR SEMICONDUCTOR DEVICES

(75) Inventor: Philip Joseph Koh, Centerville, VA (US)

(73) Assignee: Sophia Wireless, Inc., Chantilly, VA (US)

(*) Notice: Subject to any disclaimer, the term of this patent is extended or adjusted under 35 U.S.C. 154(b) by 0 days.

(21) Appl. No.: 09/752,725

(22) Filed: Jan. 3, 2001

(65) Prior Publication Data

US 2001/0033014 A1 Oct. 25, 2001

Related U.S. Application Data

(60) Provisional application No. 60/174,263, filed on Jan. 3, 2000.

(51) Int. Cl.[7] .......................... H01L 23/52; H01L 23/02
(52) U.S. Cl. ................. 257/692; 257/685; 257/678; 257/723; 257/728
(58) Field of Search .................. 257/678, 685, 257/686, 692–698, 700, 723–725, 728–733; 361/735, 809, 773, 772

(56) References Cited

U.S. PATENT DOCUMENTS

| | | | |
|---|---|---|---|
| 4,080,026 A | | 3/1978 | Gianni |
| 4,696,525 A | * | 9/1987 | Coller et al. .................. 439/69 |
| 5,157,480 A | * | 10/1992 | McShane et al. ............. 357/74 |
| 5,172,303 A | * | 12/1992 | Bernardoni et al. ........ 361/396 |
| 5,376,825 A | | 12/1994 | Tukamoto et al. |
| 5,570,273 A | * | 10/1996 | Siegel et al. ................. 361/773 |
| 5,642,265 A | * | 6/1997 | Bond et al. .................. 361/809 |
| 5,754,408 A | * | 5/1998 | Derouiche .................. 361/773 |
| 5,790,381 A | * | 8/1998 | Derouiche et al. .......... 361/735 |
| 5,825,082 A | | 10/1998 | Takahashi |

FOREIGN PATENT DOCUMENTS

| | | | | |
|---|---|---|---|---|
| JP | 2-150053 | * | 6/1990 | .......... H01L/23/50 |
| JP | 2-197154 | * | 8/1990 | .......... H01L/23/32 |
| JP | 5-36856 | * | 2/1993 | .......... H01L/23/04 |
| JP | 5-152468 | | 6/1993 | |

* cited by examiner

Primary Examiner—Tom Thomas
Assistant Examiner—Ori Nadav
(74) Attorney, Agent, or Firm—Sughrue Mion, PLLC

(57) ABSTRACT

A direct attachment technique is described for silicon packages housing high frequency devices. A silicon package may be shaped as either a plug or a socket or the package may have both the plug and socket capability, thus enabling the package to be directly attached to other packages The plug is trapezoidal in cross section while the socket has a dovetail-joint-like aperture. The plug is inserted into the socket thereby directly attaching one package to another. The two packages are locked together when the slanted edges of the plug are fitted to the slanted edges of the socket.

44 Claims, 17 Drawing Sheets

FIGURE 5
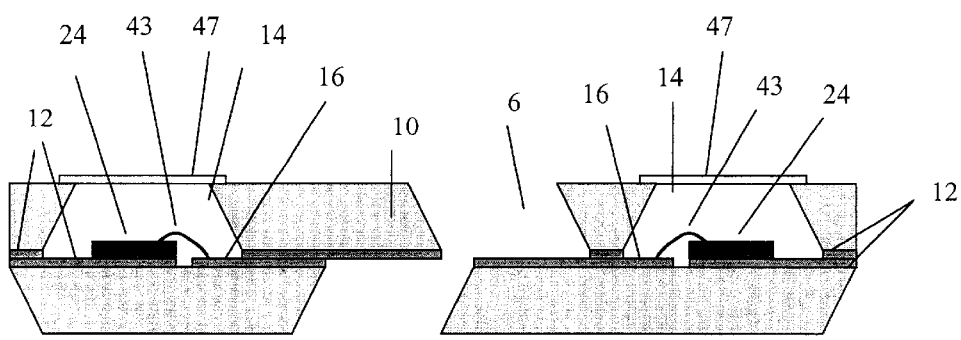
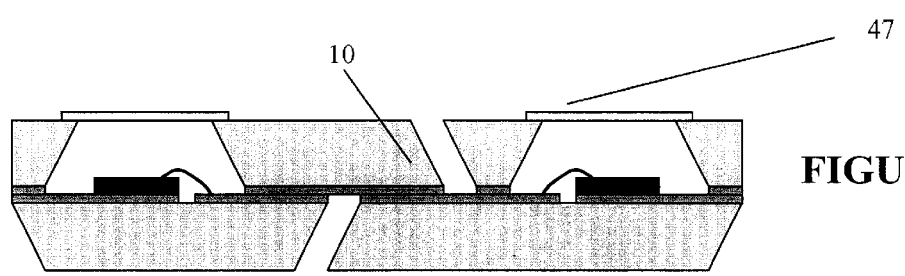
FIGURE 5a
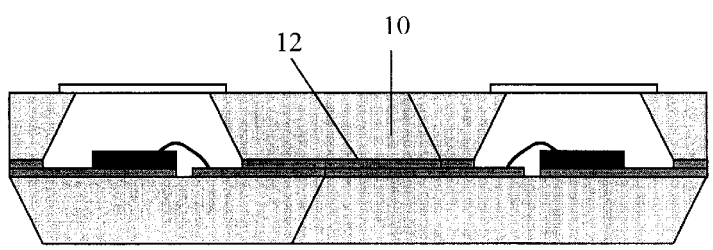
FIGURE 5b

HIGH FREQUENCY, LOW COST PACKAGE FOR SEMICONDUCTOR DEVICES

RELATED APPLICATION

The present Application claims priority from the co-pending U.S. Provisional Patent Application Ser. No. 60/174,263, filed Jan. 3, 2000 the contents of which are incorporated herein by reference.

BACKGROUND OF THE INVENTION

1. Field of the Invention

The present invention relates inter alia to a micromachined package useful, for example, for high frequency circuits and also to a method for directly interconnecting silicon packaged circuits.

2. Description of Related Art

The integration of Monolithic Microwave Integrated Circuits (MMIC's) into high frequency communication systems and devices has increased the need for a low cost packaging system that can be mass produced. Conventional packing techniques are inadequate for high frequency devices, such as the MMIC, because the package fails to adequately transmit the signal thus resulting in a loss with every transition.

Traditionally, integrated circuits (IC) formed on a semiconductor chip are packaged by enclosing the chip within a plastic or ceramic casing and then attaching wire bonds between the pads of the chip and the package leads which can be soldered to a circuit board. This technique is acceptable for low frequency devices. When applied to high frequency devices however, the millimeter components corresponding to the high frequency components of the signal exhibit odd behavior because the standard package can not carry the high frequency signal. These losses and the erratic signal behavior occur as a result of the internal structure of the package and the signal transitioning from one package down to the circuit board and back up into another package.

In addition to the need for a low cost packaging with low signal loss, a solution is also needed to solve other assembly problems. For example, assembling a module having multiple chips using either the traditionally packaged chip or bare die assembly requires extensive time sacrifices and numerous prototype iterations before a final design is produced. Forming modules using conventionally packaged chips mandates numerous hours of design and tedious wire bonding that often results in mistakes, thus requiring the module to be either scrapped or reassembled. The long time needed to produce a module greatly increases the manufacturing cost. Accordingly, there is an immense need to eliminate multiple prototype iterations and the long time needed to produce packaged integrated circuits useful in high frequency applications, by creating a low cost package and packaging method, with interconnection capabilities between packaged integrated circuits, thus enabling a module to be assembled with exact precision in a short period of time.

SUMMARY OF THE INVENTION

The present invention solves the above disclosed and other problems by introducing a low cost packaging technology for high frequency devices wherein individual packages can be directly attached to one another and then surface mounted as a unit to form a module of multiple integrated circuits on multiple chips. As will be described in detail below, one or more chips with integrated circuits can be mounted on a substrate of high resistivity material with metal conductors patterned on the substrate. A means is provided for coupling the desired wave signals from one side of the substrate to the other side through the substrate.

Additionally, the package has the capability to be interconnected with other packages. The package may be shaped as either a plug or a socket or the package may have both the plug and socket capability. The packages are then directly attachable to one another.

Direct package-to-package attachment provides significant performance advantages over circuit-board-based interconnections. By directly attaching the packages to one another, the signal is directly transmitted between packages. The interconnection therefore solves the signal loss problem experienced using traditional packaging techniques by preventing the signal from repeatedly passing up and back between the packages and circuit board. The technology of the invention greatly simplifies the RF design since the transmission line maintains essentially a constant cross-section until immediately before reaching the MMIC.

The interconnection packaging technology of this invention offers immense commercial capabilities since the interconnection of packages enables various modules of multiple packages to be assembled quickly. Thus, integrated circuits can be packaged in packages of the invention and multiple packaged circuits can be quickly and easily joined together to form selected circuit combinations, such as amplifiers easily connected with modulators and the like. The electrical characteristics of the packages being very similar assures not only low losses between packages but repeatability of circuit characteristics among the supply of packaged circuits. Thus, the prepackaged chips are standardized, thereby guaranteeing precise circuit characteristics as a result of the constant circuit environment and connections. Using plural prepackaged chips of the invention, a designer can create a module by selecting the appropriate prepackaged chips and directly coupling the packages to one another (i.e.: a plug and play concept). This ability allows modules to be created in a rapid and precise environment, thereby eliminating the traditional prototype to final design procedure that required weeks to perfect.

In one aspect of the invention, a package having interconnection capabilities uses a plug-and-socket approach. Two substrates made, for example, from silicon or ceramic or other suitable material for micromachining, are fabricated to include at least one of a male (plug) and female (socket) formation. The plug may be trapezoidal in cross section while the socket may have a dovetail-joint-like aperture. The plug is accepted by the socket thereby directly attaching one IC package to another. The two packages would be locked together when the plug portion is fitted to the socket portion. Of course the plug/socket combination s not limited to the trapezoidal/dovetail cross section or even to the male/female type connector arrangement. The invention envisions any type of direct, stable intersection between packages using connector portions integral with the respective substrates of interconnected packages. These connector portions further include respective contact portions for electrical signed flow.

In another aspect of the present invention, the package's direct attachment configuration may comprise a cross type layout wherein two or more connectors, for example, four plugs/sockets are provided with one plug or socket extending from a respective edge of the package. Such a configuration allows multiple packages to be coupled to a single package of the invention. Any module configuration that enables two or more packages to be coupled together are within the scope of this invention.

In yet another aspect of the present invention, two packages of the invention are held together by a flexible spring formed integral with the package substrate. The spring applies a compressive force when the two packages are mated, thus bringing the respective contact portions are placed in electrical contact. The spring may create a frictional force keeping the components coupled together. The spring edges may be tapered to ease insertion into a spring seat on an adjoining package, consequently providing a positive lock when the packages are fully joined together.

In still another aspect of the present invention, two packaged MMIC's are directly coupled via a double plug configuration. The double plug configuration utilizes one plug for providing coarse alignment, which may be termed a guide plug, while the second plug carries the signal and may be termed a signal plug. The signal plug provides the spring binding force. In this configuration, the guide plug restricts the signal plug's range of travel so that the movement of the signal plug in the socket does not exceed the maximum excursion of the spring, regardless of the position and direction in which the packages are brought together.

In still another aspect of the present invention, a package is fabricated to provide full encapsulation of a semiconductor chip. The semiconductor chip is sealed within a cavity formed between two or more patterned substrates. Alternatively, the semiconductor chip is mounted between two or more patterned substrates, a window may also be formed in at least one of the substrates so that the chip can be viewed through the aperture.

In another aspect of the present invention, MMICs or other integrated circuits are mounted on a package substrate prior to bonding step whereby a second package substrate is bonded to the first package substrate carrying the MMIC. The first substrate is then bonded to the second substrate thereby simultaneously sealing the MMIC between the substrates. A prepackaged semiconductor device that can be mass-produced and coupled to other devices to form a module.

In another aspect of the present invention, the integrated circuit is not mounted before wafer bonding. The IC packages are not completely sealed. Instead, the package has a window etched above the site where the IC will be mounted. In one aspect, two substrates may be bound together and with a window an forming empty package.

Many packages may be formed simultaneously on wafers such as a silicon wafer. On a first wafer is formed multiple first substrates at respective die positions in the wafer. On a second wafer may be formed multiple second substrates at respective positions. The wafer can be aligned and bonded to each other thereafter the bonded wafers can be diced apart. In one embodiment, ICs can be mounted between the two substrates before the wafers are diced apart. In another embodiment no ICs are mounted before the dicing operation and after the dicing the individual packages formed by each die can be sold as an empty package. A user could then mount an IC such as an MMIC through a window located on the package. The user could then wire bond the connections and seal the packages with a cap, such as a metal cap.

Objects, features and advantages of this invention is to provide a low cost mass producible package and packaging system that can be used with high frequency devices. An aspect of the packaging system of the present invention is to enable the packages and the chips mounted therein to be interconnected via a direct attachment to one another thereby reducing loss. The present invention also eliminates the multiple prototype cycle inherent in traditional module design by providing a technology wherein a module may be immediately created by assembling prepackaged IC's with interconnecting capabilities.

Further objects, features and advantages of the invention will become apparent from a consideration of the following description and the appended claims when taken in connection with the accompanying drawings.

BRIEF DESCRIPTION OF THE DRAWINGS

The above aspects of the present invention will become more apparent by describing in detail embodiments thereof with reference to the attached drawings, in which:

FIGS. 5, 5a, and 5b are cross-sectional views down the centerline of the package shown in FIG. 2.;

DETAILED DESCRIPTION OF THE INVENTION

Hereinafter, embodiments of the present invention will be described in detail with reference to the attached drawings. The present invention is not restricted to the following embodiments, and many variations are possible within the spirit and scope of the present invention. The embodiments of the present invention are provided in order to more completely explain the present invention to one skilled in the art.

Figure 1:
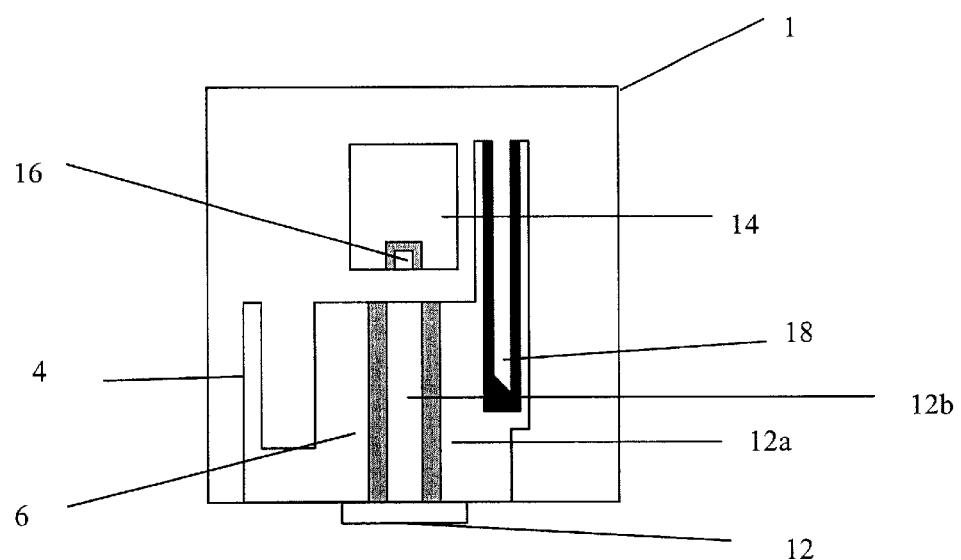
FIG. 1 is a plan view of a first embodiment of a micromachined package according to the invention having a double socket interconnection configuration.
Figure 1A:
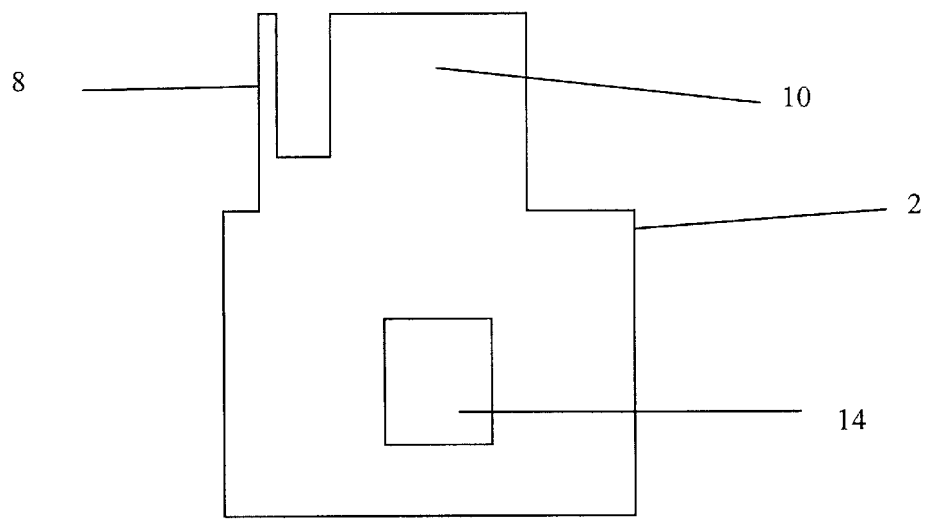
FIG. 1a is a plan view of a first embodiment of a micromachined package according to the invention having a double plug interconnection configuration.
Figure 16:
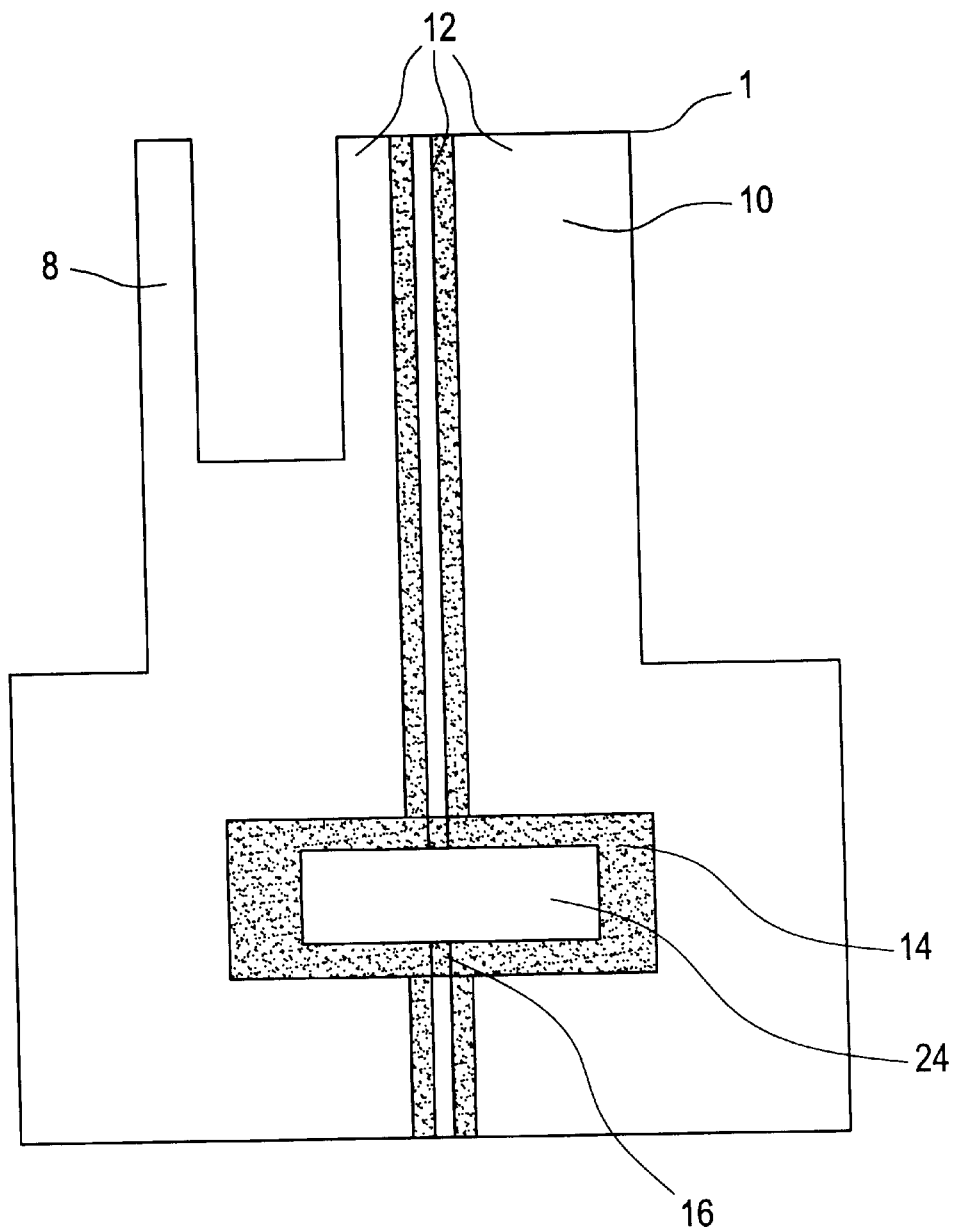
FIG. 16 is an underneath perspective of the double plug configuration depicted in FIG. 1a showing electrical conductors for carrying including high frequency signals.

Referring to FIG. 1, FIG. 1a and FIG. 16, an embodiment for directly attaching at least two packages housing high frequency semiconductor devices together using a plug-and-socket approach is illustrated. FIGS. 1, 1a and 16 will be jointly described, thus it is important to note that FIG. 1a and FIG. 16 are the same double plug silicon package however, FIG. 1a illustrates an external view of the double plug silicon package while FIG. 16 depicts an internal (or bottom) view of the double plug silicon package. The packages may be formed of a material that can be micromachined. An example, of such a material is silicon. Although the invention is not limited to silicon for the substrate materials the following description is provided using silicon as an example of the package material and particularly of the substrate material forming the package.

In this technique, two silicon structures are fabricated, each 20 having a male and/or female component. Specifically, FIG. 1 depicts a plan view of a double socket type silicon package (1) having both a guide socket (4) and an original socket (6). FIG. 1a and FIG. 16, on the other hand, illustrate a double plug silicon package (2) having both a guide plug (8) and a signal plug (10). Generally, the double plug silicon package (2) of FIG. 1a is fitted into the matching sockets of the double socket type silicon package (1) of FIG. 1, thereby allowing direct attachment of two devices such high frequency devices in a manner that enables efficient signal transmission for high frequency semiconductor devices.

The double socket type silicon package (1) and the double plug silicon package (2) are fabricated using two high-resistivity silicon wafers for each package. The fabrication process will be fully described below. As can be seen in FIG. 1, the double socket type silicon package (1) contains a circuit aperture (14) for housing an integrated circuit, preferably an MMIC. The double plug silicon package (2) also contains a circuit aperture (14). Any type of circuit, including passive or active circuits, can be packaged using the silicon-based packaging technology of the present invention. Other devices, such as optical fibers, may be housed using the silicon based package having a male or female component, thereby allowing optical fibers to be directly coupled to one another.

Both silicon packages (1) and (2) further contain a center conductor line (12b) separated by a non-metallized channel from a ground conductor (12a) on either side that run along the flat mating surfaces of the signal plug (10) and socket (6). The electrical conductors (12) for the double plug silicon package (2) are illustrated in FIG. 16. Several transmission-line/waveguides variations are possible. For example, an electrical connection can be made utilizing the coplanar waveguide-stripline (CPW-stripline) technique. This technique, as depicted in FIG. 1 and FIG. 16, employs a center conductor (12b) surrounded by two planar ground conductors (12a). The conductors may be electroplated gold metal areas, separated by unmetallized channels which expose the high-resistivity substrate. Once the signal plug (10) is inserted into the socket (6) and a tight fit is formed (as will be fully explained below), the conductors (12) all make contact. Electrically, each pair of overlaid conductors (12) act as one.

The CPW-stripline transmission line runs inside each silicon package (1) and (2), where a connection is made to the MMIC located in the circuit aperture (14). This is accomplished by forming a cavity in the upper wafer to provide clearance. At this point, the transmission line makes a transition from TEM-mode CPW-stripline (which is fully surrounded by silicon) to quasi-TEM mode CPW (with silicon below and air above the plane of the conductors) (16). This transition is achieved by tapering the center conductor (12b) to achieve equal impedance and then a wire or ribbon bond makes the connection to the MMIC. This bond couples a signal input or signal output pad of the MMIC to the center conductor (12b) of the transmission line.

Unlike conventional surface mount attachment technology, in the present invention, the signal does not travel up or down between packages and through a printed circuit board. This greatly simplifies the RF design, since the transmission line maintains constant cross-section until immediately before reaching the MMIC. Such a design has inherently extremely wide bandwidth.

Referring to the FIG. 1, FIG. 1a and FIG. 16, the silicon 10 packages illustrate an embodiment of the direct attachment method of the present invention. Specifically, a double plug and socket configuration is used to join the two silicon packages together. A double plug silicon package (2) has a guide plug (8) that provides coarse alignment when signal plug (10) is inserted into signal socket (6) of the silicon package (1), wherein signal plug (10) carries the signal via the electrical conductors (12). A flexible silicon spring (18) is used to apply compressive force when the signal plug (10) is inserted into the socket (6). The spring beam (18) generates a frictional force on the signal plug (10) to secure the two packages together. Additionally, the edges of signal plug (10) and the spring beam (18) can be tapered to allow easy insertion and a positive lock when signal plug (10) is fully inserted into signal socket (6).

The guide plug (8), as depicted in FIGS. 1, 1a and 16, restricts the range of travel of signal plug (10) so that the movement of the signal plug (10) in the signal socket (6) does not exceed the maximum excursion of the silicon spring beam (18), regardless of the position and direction in which the two packages are brought together.

Once signal plug (10) of silicon package (2) is inserted into socket (6) of silicon package (1), there is a tight fit, with only very small air gaps remaining between the silicon of the two packages. Once in a fully inserted position, the plug (8) (10) and socket (4)(6) overlap in a precise way so that the electrical conductors (12) overlap and touch, allowing the signal to flow from one package to the other. The two packages are then handled as a unit, and are mounted on a circuit board or within a separate housing to form a module. DC power and low frequency control signals may be connected by conventional surface mount connections to a circuit board or by wire bonds.

Figure 2:
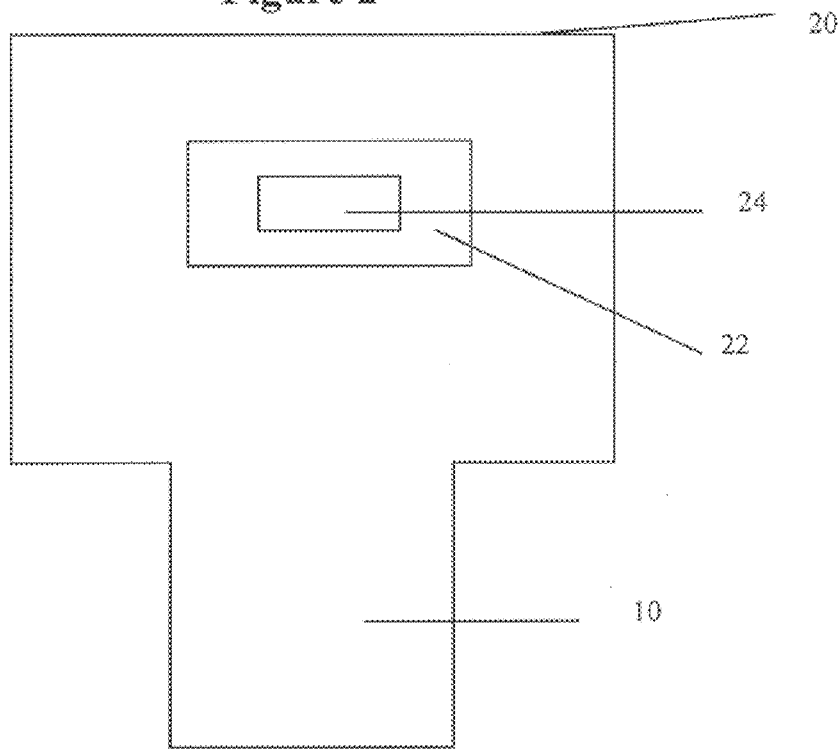
FIG. 2 is a plan view of an alternative embodiment of a micromachined package of the invention having a single plug interconnection configuration.
Figure 2A:
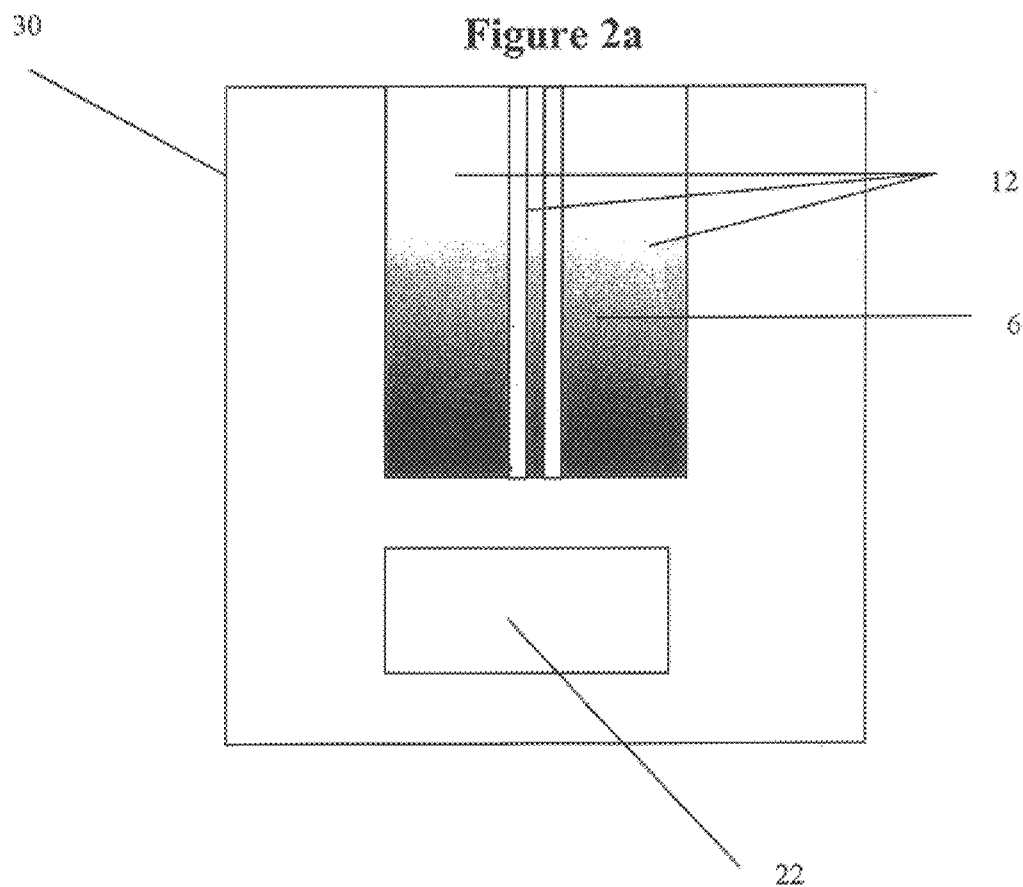
FIG. 2a is a plan view of an alternative embodiment of a 5 micromachined package of the invention having a single socket interconnection configuration.
Figure 17:
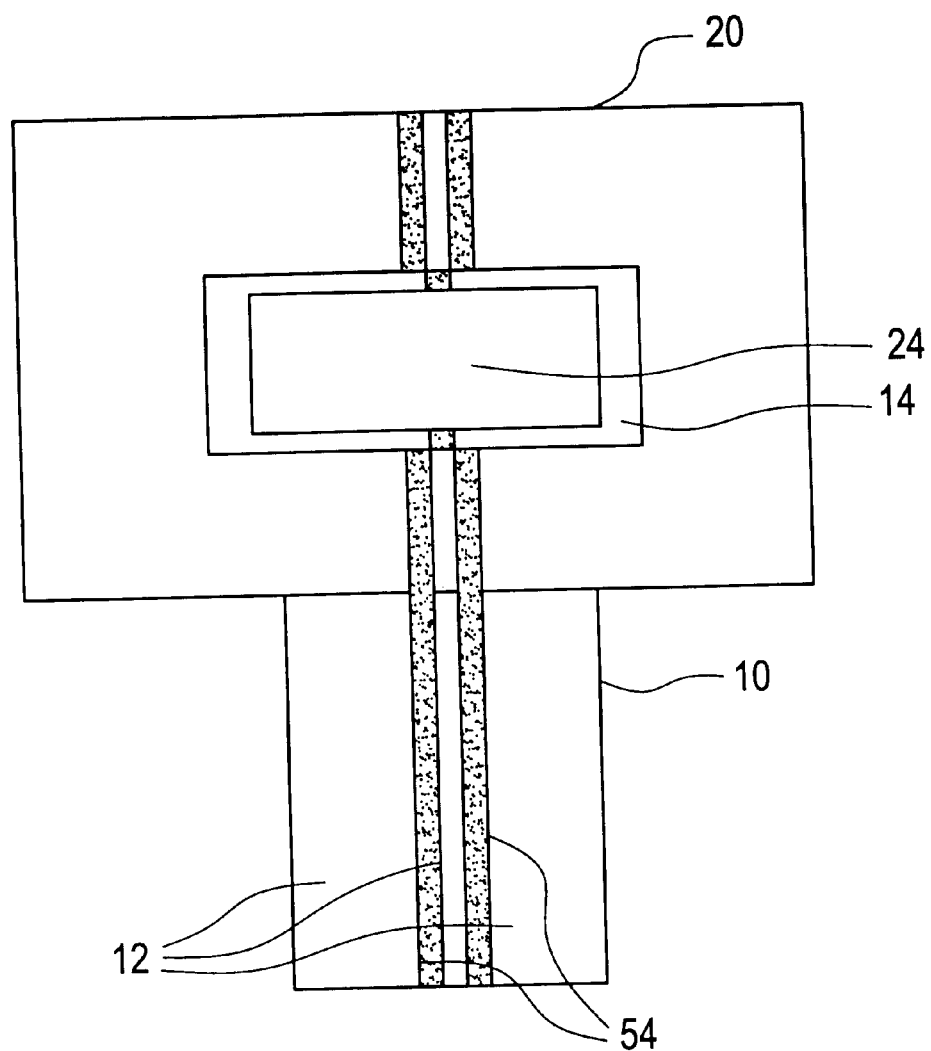
FIG. 17 is another plan view of the single plug configuration depicted in 2a showing electrical conductors and FIG. 18 is an exemplary view of the present invention's direct attachment technique, wherein a package has a chip for any number of plug and socket components.

Referring to FIGS. 2, 2a and 17, another aspect of the present invention using a single plug and socket configuration to directly attach two silicon packages that house high frequency semiconductor devices is illustrated. FIG 2 and FIG. 2a depict the external surface of a single plug silicon package (22) and single socket silicon package (30) that can be interconnected by inserting signal plug (10) into socket (6).

As shown in FIG. 2, the single plug silicon package (20) has a circuit window (22), usually enclosed by a metal cap, wherein a circuit (24) is housed.

Such a circuit window may be used independent of the plug/socket arrangement of the packages and thus such an optional window may be also used in the embodiment of FIGS. 1–15 The circuit window (22) enables circuits to be placed in the silicon package after the silicon package is fabricated. Thus, empty silicon packages can be sold such that the buyer can choose which circuit to place within the package. FIG. 2a depicts a silicon package with a circuit window (22) ready to accept any circuit. In another embodiment of the present invention (not shown), the circuit (24) is fully encapsulated by the silicon substrates, thus a circuit window (22) is not provided.

FIG. 17 depicts a bottom portion view of single plug silicon 15 package (20), wherein the electrical conductors (12) and non-metalized channels (54) form the transmission line (12), and circuit (24) is located within the circuit aperture (14). As described above, the signal plug (10) of the single silicon package (20) is inserted into the socket (6) of package (30). Once fully inserted, the electrical conductors of silicon package (30) and silicon package (20) make contact thereby enabling a signal to pass between the two circuits housed in individual silicon packages that are directly attached.

Figure 3:
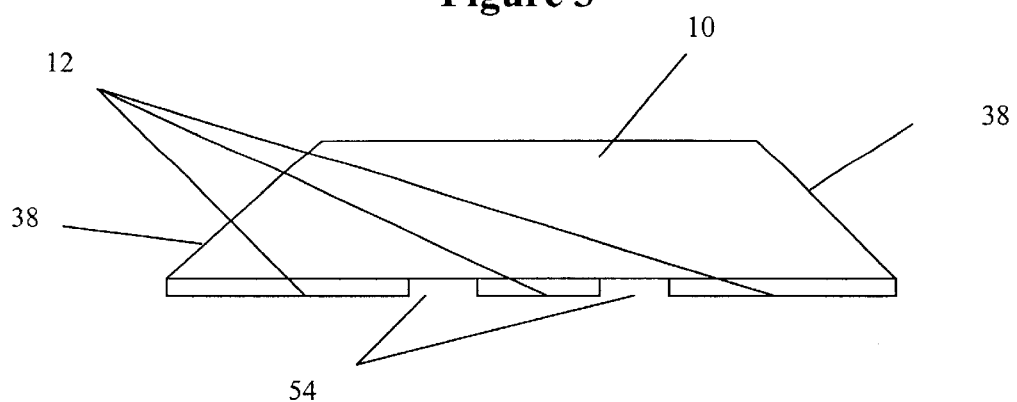
FIGS. 3 and 3A are cross sectional views of the plug and socket type connectors with transmission line metal for propagating a wave signal including millimeter wave signals.
Figure 3A:
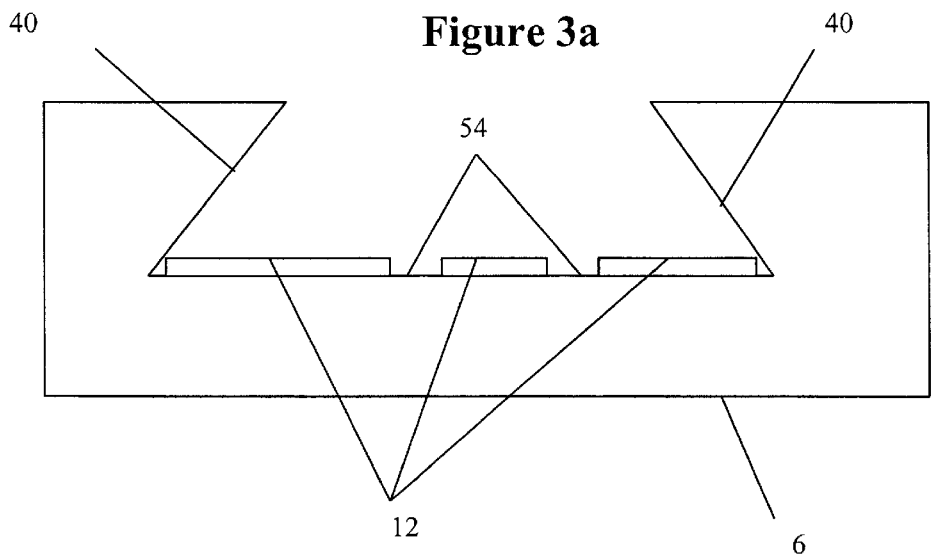

In another aspect of the present invention depicted in FIG. 3, the signal plug (10) and socket (6) are held together as a result of inversely slanted edges. FIG. 3 illustrates the signal plug (10) as trapezoidal in cross section while socket (6) is formed as a dovetail-joint-like aperture that accepts the signal plug (10). The angled edges of the socket (40) create a dovetail-joint like aperture that welcomes the slanted edges of the plug (38) to ensure a tight fit between the two silicon packages. The angles of the slanted edges (38)(40) with respect to vertical is the same on both the signal plug (10) and socket (6). The three electrical lines/conductors (12) may be gold, but any other metal may be substituted. The two gaps between the three conductors are bare silicon (54) of the substrate.

Figure 4:
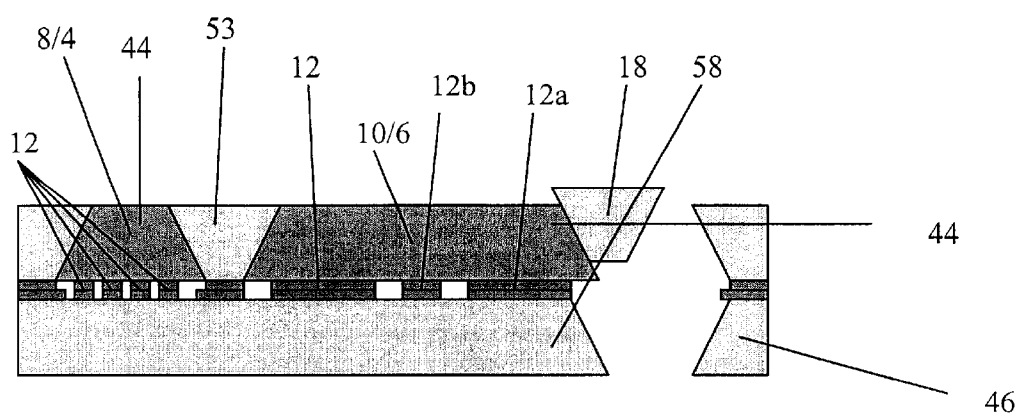
FIG. 4 is a cross sectional across the double plug inserted into the double socket view of the interconnection system of the present invention wherein the plug is fully inserted into the socket.

Referring to FIG. 4, a cross sectional view, across a double plug inserted into a double socket is illustrated. In FIG. 4, a silicon package (44), having a signal plug (10) and a guide plug (8), is fully inserted into the silicon package (46) having two sockets (4)(6).

Electrical contact is made upon full insertion of the plug into the socket when the overlapped metal of the plug and socket form the center conductor (12b) and ground planes (12a) of the CPW-stripline transmission line. Furthermore, the guide plug (8) may provide DC and IF connections via several gold lines on the bottom of the guide plug (8) and several gold lines on the surface of the guide socket (4). Upon insertion of the plug (8) into the socket (4), the conductors (12) come into contact thus providing DC and IF connections.

The silicon piece (53) on the double socket silicon package separates the two sockets (4) and (6). The angled edges of (53), as seen in FIG. 4, illustrates the dove-tail sockets (4) (6) that keep the two silicon packages connected to one another when the signal plug (10), having slanted edges, is inserted into the socket (6).

FIGS. 5–5b provide another cross sectional view of a silicon package having a plug being inserted into a silicon package having a socket. The silicon package further comprises a circuit aperture (14) for housing the integrated circuit (24) which is wire bonded (43) to the electrical metal conductors (16) of the CPW line.

As illustrated in FIG. 5, the electrical conductors (12) run the length of both silicon packages. When the signal plug (10) is inserted into the socket (6), as depicted in FIGS. 5a and 5b, the electrical conductors (12) overlap and touch, allowing the signal to flow from one package to the other. FIG. 5 further illustrates an embodiment of the present invention wherein the circuit is not fully encapsulated within the silicon package. This allows the circuit to be placed within the package at any given time after the silicon package is fabricated. Once a circuit is placed in the package, a lid (47) is placed over the circuit aperture (14) to protect the circuit (24). In an alternate embodiment of the present invention, the circuit is fully encapsulated within the silicon package.

Figure 6:
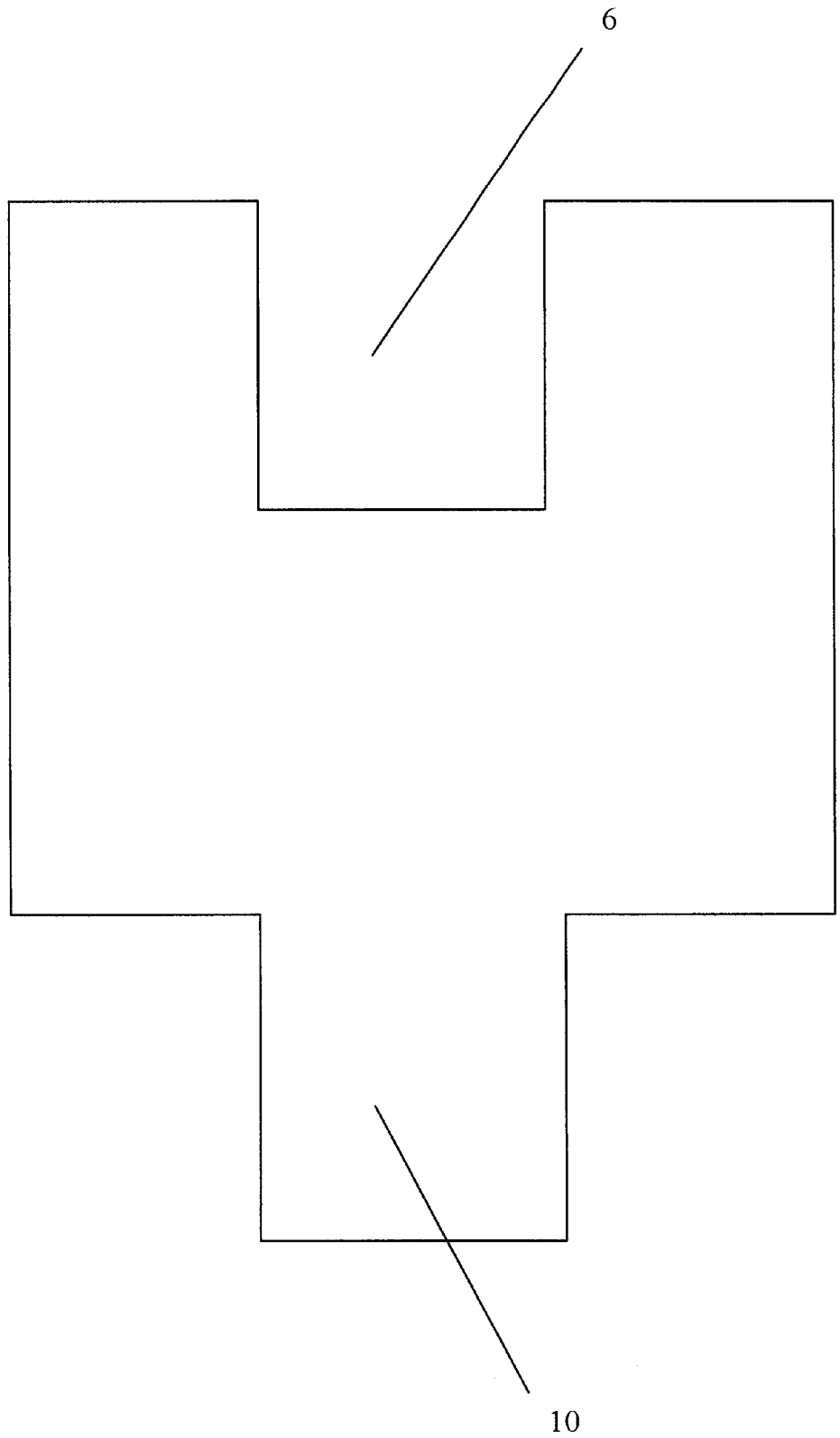
FIG. 6 is an alternative embodiment of a micromachined package having a plug located at a longitudinal end and a socket located at the other longitudinal end.
Figure 7:
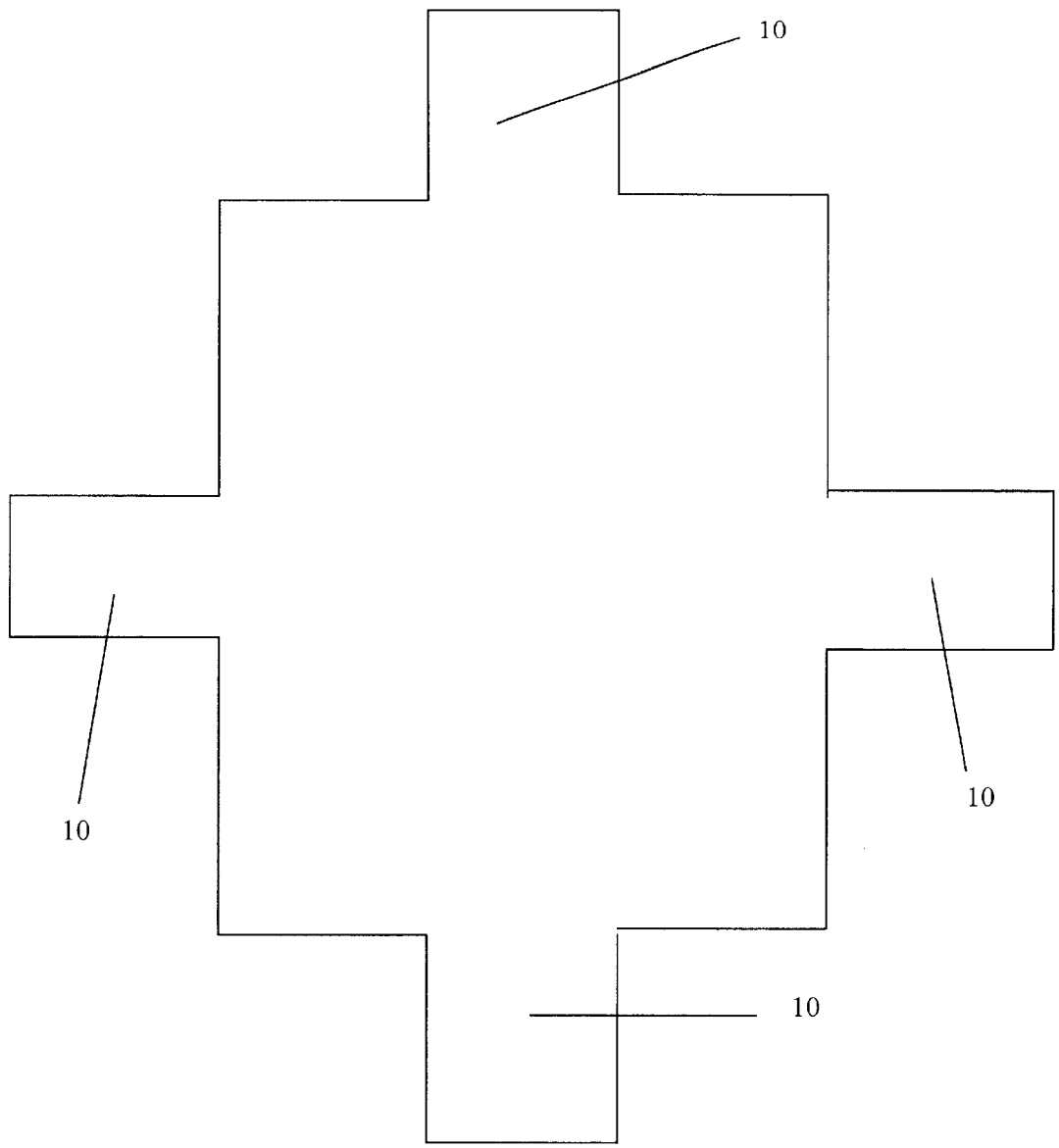
FIG. 7 is an alternative embodiment of a micromachined package having a quad plug interconnection configuration.
Figure 8:
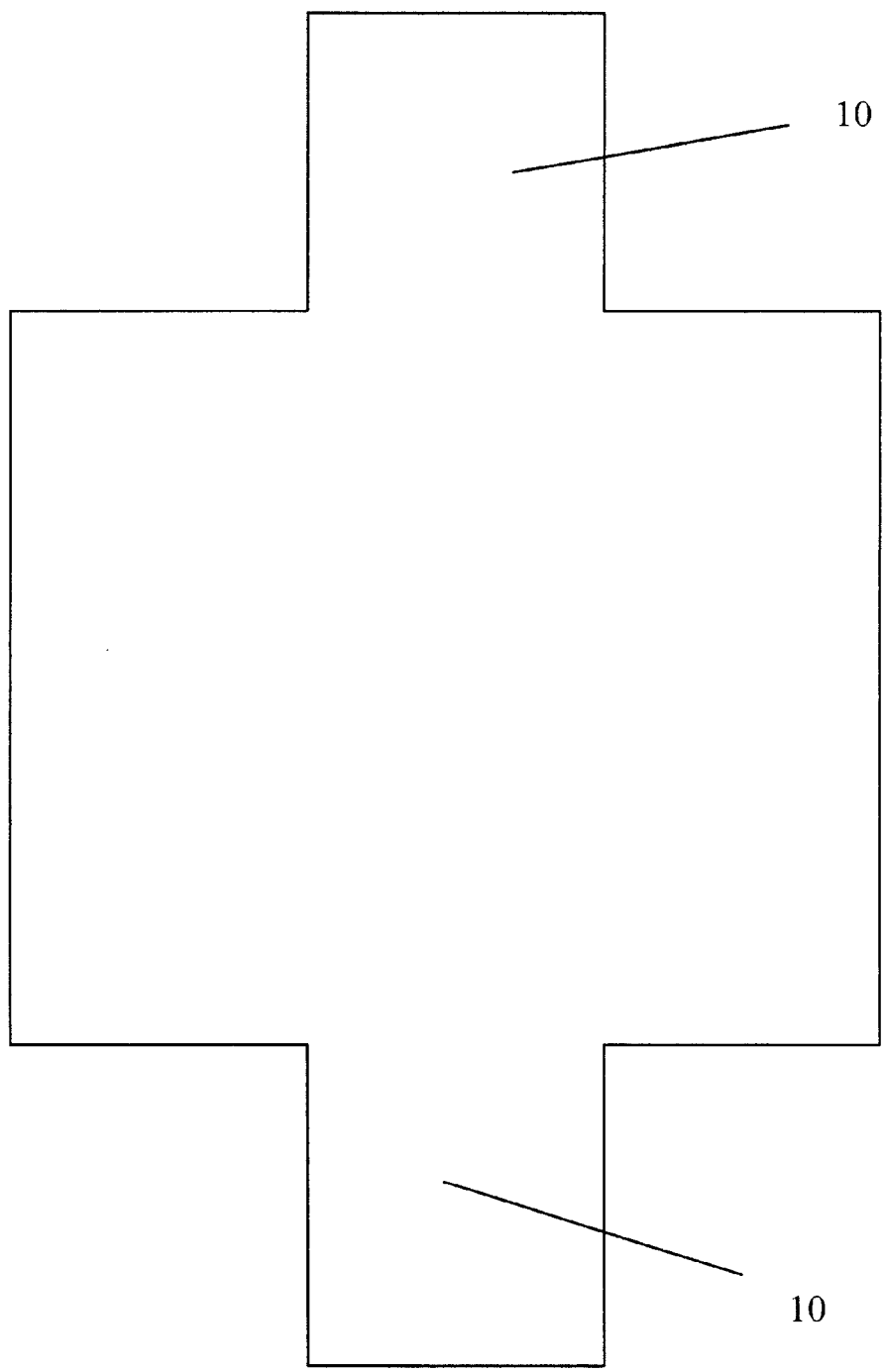
FIG. 8 is an alternative embodiment of a micromachined package having a plug located at each end of the silicon package.

FIGS. 6–8 depict additional aspects of the present invention, wherein a silicon package is fabricated having multiple plug and socket components. These additional aspects illustrate preferred configurations for directly attaching silicon packages that house high frequency devices together, however, any and all configuration, utilizing a connector attachment structure fall within the ambit of this invention.

Specifically, FIG. 6 illustrates a silicon package having a socket located at one edge of the silicon package and a plug located at the opposite edge of the silicon package. The plug and socket may be located at any point along the edges of the silicon package and is therefore not limited to the edges of the package shown.

Referring to FIG. 7, a silicon package having four plugs is illustrated. One plug is located at each side of the silicon package. Any package shape having a connector formation of the present invention may be utilized.

Figure 18:
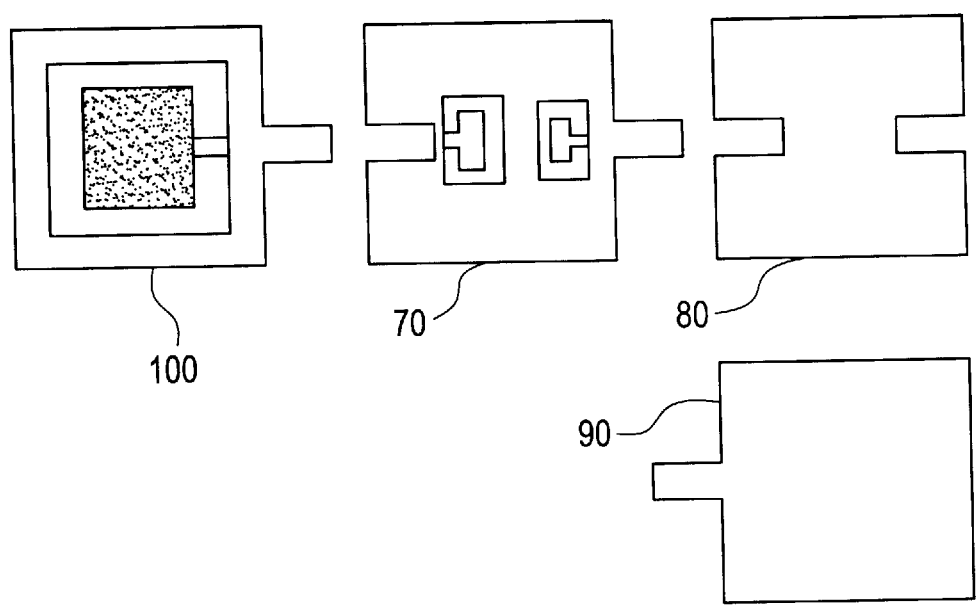

Referring to FIG. 8, a silicon package having a plug located at each end of the silicon package is illustrated. The silicon package may comprise two sockets located at each end of the silicon package. As disclosed above, the plugs/sockets may be located at any point along the silicon package. Furthermore, as shown in FIG. 18, it is possible to have multiple chips within a package, and depending on the function, they may require any number of plug or socket components.

The fabrication of the packages may be performed using standard micromachining techniques. An embodiment of the fabrication process for a double-plug silicon package wherein one guide plug provides coarse alignment while the other plug carries the RF signal, is fully described below.

The silicon package fabrication process begins with two high-resistivity silicon wafers, approximately 20 mils thick, double side polished, hereinafter referred to as wafer 1 and wafer 2. The wafers are cleaned using an industry standard RCA cleaning process. A wet oxidation is performed using a conventional wetox process thereby heating the wafers to 1200° C. for four hours in a wet oxygen atmosphere. Thermal oxides approximately 1.2 microns thick are grown on both wafers.

Next, a standard double-side photolithography cycle is performed. A coating of photoresist is applied to the backside of the wafer by spin coating and is then hard baked. A coating of photoresist is also applied to the front side of the wafer. The wafers are then patterned with the appropriate masks on both the top and bottom side.

Following the photoresist cycle, the pattern is transferred into the silicon oxide layer by wet etching. Upon completion of the wet etch, the photoresist is stripped using a standard stripper. This oxide forms a mask that protects some areas of the silicon, while areas with no oxide are exposed.

For certain types of packages, via holes are required which make electrical connection from one side of the wafer to the other. In these packages, small holes are etched from the top of wafer 1 through to the bottom side. For these holes, the aperture in the top side oxide may be square and the length of each side of the aperture is roughly twice the wafer thickness. For packages with via holes, the wafers are deep silicon etched before metal plating. For packages without via holes, the silicon etching is performed last.

The wafer is subsequently cleaned and a thin film of metal is applied as a seed layer for electroplating. The thin film is deposited by vacuum or sputtering and comprises approximately 10 nm of Chrome followed by approximately 100 nm of gold. Upon completion, the standard photoresist cycle is performed again using a photomask for metal patterning.

Photoresist is applied and patterned to form the openings where metal will be electroplated. For wafers with via holes, a conformal coating of photoresist is required. This requires the use of an optimized coating process typically using thicker photoresist, slower spin speeds, and low baking temperatures. The photoresist is patterned in a contact aligner.

This pattern will consist of the CPW lines used to carry the RF signal down the plug into the receptacle. Also, the pattern will remove resist inside the via holes and from around the perimeter of the via hole; after plating, this will form a pad on the top and a pad on the bottom which are electrically connected. Gold metal is electroplated onto the wafer (for example 4 micron thickness), and then the resist is removed. The wafer is re-patterned for electroplating of the bonding metal. This pattern places bonding metal in any areas where the two wafers come into contact, except under the cantilevered silicon spring beam, which should not be attached to wafer 1 since it must be free to bend. The bonding metal is any metal which bonds under heat treatment. Examples are Tin/Lead eutectic or Tin/Gold eutectic. The photoresist is stripped, and the electroplating base is removed by wet etching or sputter etching.

For packages which have no via holes and have not yet been etched, the wafer is now ready for deep silicon etching. The wafer is immersed in a reflux tub of TMAH that causes the silicon to be removed from areas not protected by metal or silicon oxide. The wafers are removed once the etched features have proceeded all the way through the wafer. Additionally, etching may be added as needed to round the corners and other features to the exact design and shape.

Wafer 2 is bonded onto the top of Wafer 1 using an aligner-bonder. They are clamped together so that all features align correctly, and then they are bonded by a heat cycle. For example, with Sn/Pb bonding metal, a 15 minute cycle to 220° C. in a forming gas atmosphere is typically sufficient. After bonding, the stack of wafers is cut into individual packages with a dicing saw. The cuts are aligned to the package to properly define the edges of the package.

In an alternate embodiment of the invention, the above photomasks are modified somewhat to improve the definition of the features. Typically, convex corners of silicon etch quickly get rounded. Thus, a standard technique is to add extensions to the corner, so that after etching it will be less rounded. The proper size of this extension for a particular etching system is determined by etching test wafers with a range of extension sizes. The mask patterns for the socket and plug silicon etches are modified to incorporate the convex-corner protection extensions.

Figure 9:
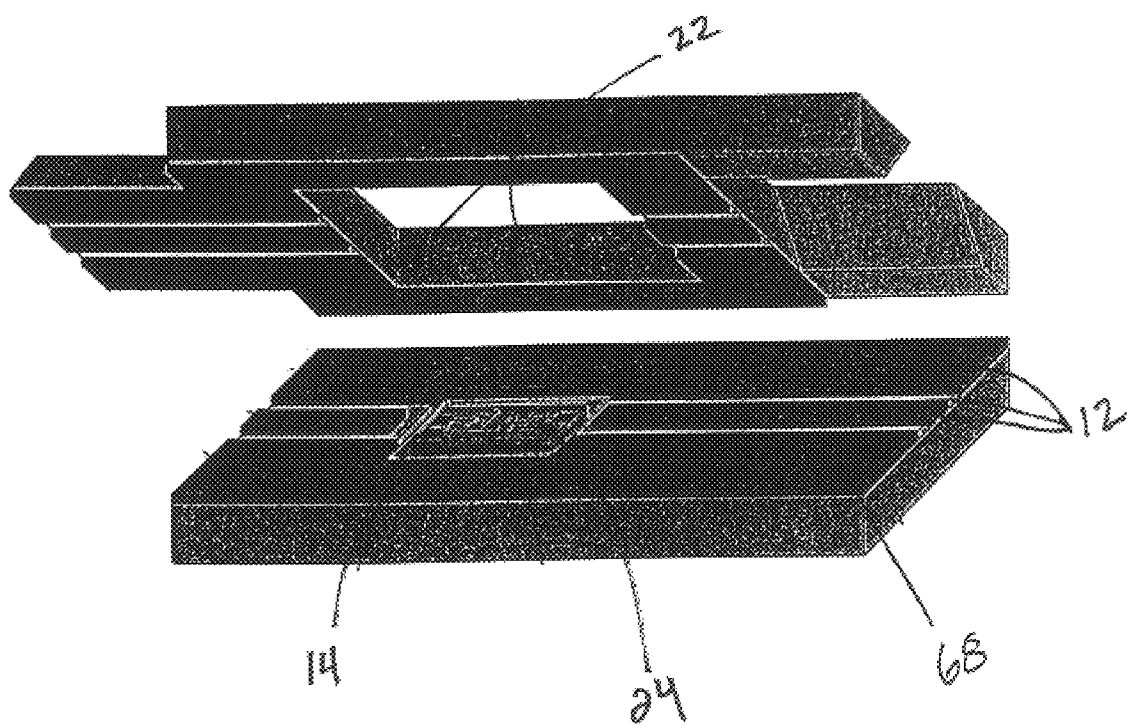
FIG. 9 is an exploded perspective view of a MMIC package having a bottom substrate and a top substrate.

Referring to FIG. 9, a cavity/circuit aperture formed within the silicon substrate to mount a chip is illustrated. By making the cavity/circuit aperture (14) depth approximately equal to the chip thickness, the top surface of the chip (24) after mounting is made level with the silicon surface (68). This allows a shorter wire bond to be used to connect the chip (24) input/output pads to the CPW line (12) on the silicon substrate (68).

The circuit aperture (14) is formed by inserting additional etching steps at the beginning of the fabrication sequence described above. The wafers are initially cleaned, and a thermal oxide grown. The oxide is then patterned with rectangular openings for the cavities. The wafer is etched in anisotropic etchant such as EDA-P to the desired depth, for example 4 mils for many MMICs. The wafer is then re-cleaned and a new thermal oxide layer is grown which seals the cavity. Upon completion of the circuit aperture/cavity, the fabrication procedure continues as described above, except that all subsequent photoresist layers are applied using a spin recipe or coater, which gives good coverage of the etched features.

Figure 10:
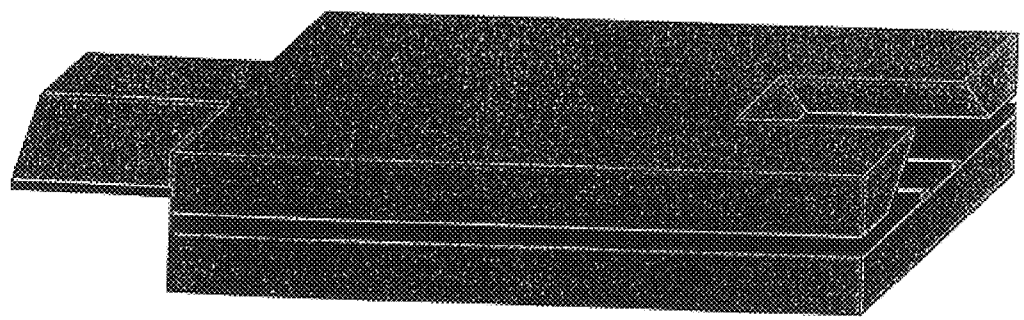
FIG. 10 is a perspective view of an assembled micromachined package fully encapsulating an MMIC.

In an alternative embodiment of the invention, chips are mounted on the silicon wafers before the bonding step. Thus, many chips are mounted on a wafer and another wafer is bonded to the first wafer, thereby simultaneously forming several sealed packages. This creates prepackaged ICs that can be directly attached to other ICs to form a module instantaneously. FIG. 10 illustrates one example of the packaging technology of the present invention wherein an MMIC is fully encased in the silicon package.

In an alternative embodiment, ICs are not mounted before wafer bonding. Instead, the IC packages are not completely sealed, but have a window etched into the silicon wafer above the site where the IC is to be mounted. The wafers are bonded together, forming empty silicon packages. The packages are diced apart, and sold as empty packages. Users then mount an IC, and an MMIC through the window in the top of the package, wire bond the connections, and finally seal the package with a metal cap. This cap is a typical package cap including, stamped metal sealed with solder preforms.

Figure 11:
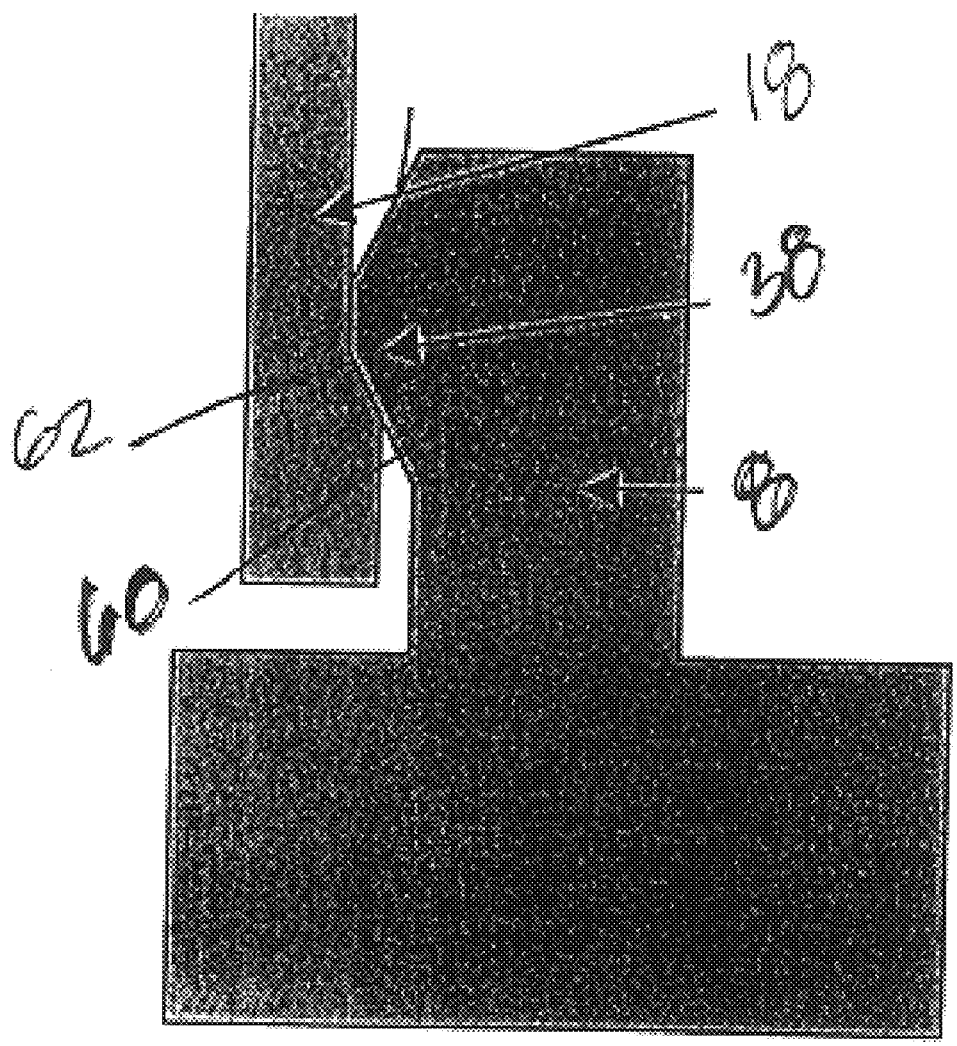
FIG. 11 is a view of an alternate embodiment employing a nub for direct attachment purposes.

Referring to FIG. 11, a nub located on both the silicon spring beam and the guide plug to provide a more positive locking action is illustrated. In this embodiment, small bumps or "nubs" (38) on both the silicon spring beam (18) and plug (8) to provide a more positive locking action when the signal plug (10) is inserted into the socket (6). The side of the plug (8) which touches the silicon spring beam (18) is slightly narrower at the tip, and moving along the plug (8) from the tip, it widens slightly, then narrows slightly. A nub/recess (62) arrangement an shown in FIG. 11 may be used.

The silicon spring beam (18) may also have a tapered shape, so that when the plug (8) is inserted, the silicon spring beam (18) will flex outward, then will move back towards its original position once the nub (38) on the plug (8) and silicon beam (18) pass each other. This provides a binding force that tends to pull the plugs (8) (10) into the sockets (4)(6). The spring beam (18) may be located at any point on the package wherein the beam is capable of applying an attaching force (compressional and/or frictional) The nubs (38) are formed by a variety of methods. A protrusion on the photomask pattern will form such a nub, however, the etching will tend to reduce or remove this nub. Experimentation is used to find the appropriate shape for the modification to the photomask pattern.

Another aspect of the present invention uses edges as shown in FIG. 11 that are angled (60) relative to the <111>crystal plane to form the nubs (38). For example, an edge (60) which is 10 degrees from the <111>plane will tend to propagate as the etch progresses, so that the angled edge (60) moves in the <111>plane at a rate of approximately five times the vertical etch rate.

In a design for 20 mil thick wafers, a propagation of approximately 112 mils is typically expected. The photomask is then adjusted so that the angled edges (60) will be in the desired position when the etching is completed. That is, the angled edges (60) are offset by 112 mils from their desired final location.

Figure 12:
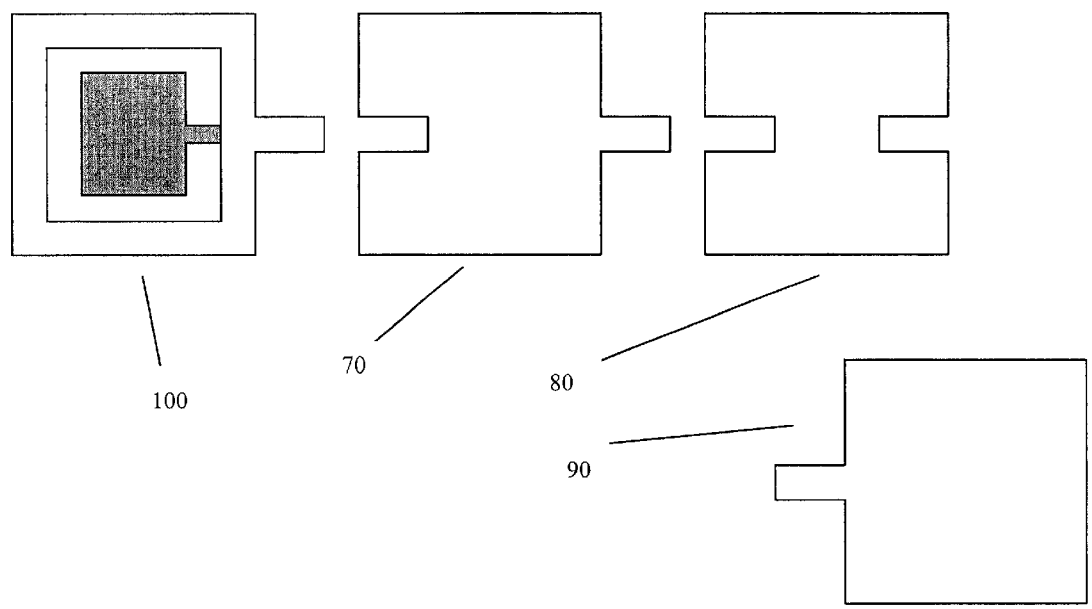
FIG. 12 is an exemplary view of the present invention's direct attachment technique.
Figure 13:
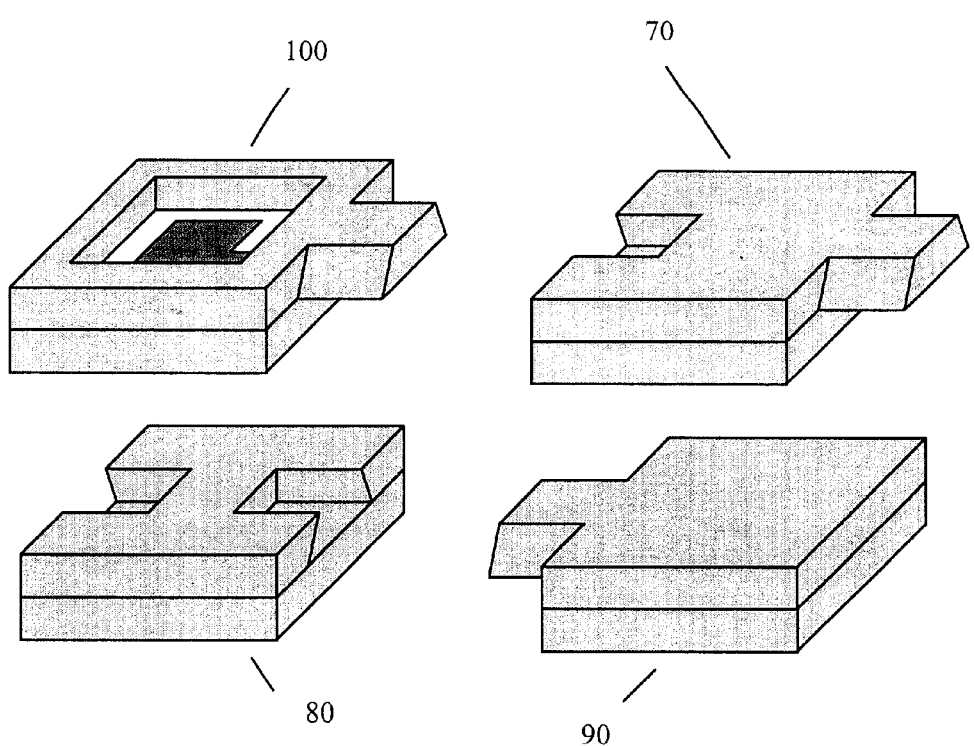
FIG. 13 is an exemplary view of the present invention's direct attachment technique using four packages to form a module.

Referring to FIGS. 12–15, a module created using the direct attachment technique of the present invention is illustrated. FIGS. 12 and 13 illustrate four silicon packages with varying direct attachment components. Specifically, Package A (70) has a plug and socket configuration whereas Package C (90) and D (100) have a single plug configuration. A double socket configuration is illustrated by Package B (80).

By inserting the plug of one package into the socket of another package, an RF connection is formed between the packages. For example, a receiver can be constructed by interconnecting the following packages: Package A (70) contains a Low Noise Amplifier (LNA) MMIC chip, Package B (80) contains a mixer MMIC chip, Package C (90) contains an oscillator MMIC, and Package D (100) contains a MMIC with a printed circuit antenna (Package D (100) has no lid, so the antenna is open to the outside).

Packages A (70), B (80), and C (90) have several via holes (not shown) passing through wafer 1 connecting pads on top of wafer 1 to pads on the bottom. These via holes may be for DC power and IF connections. Wire bonds are made from the DC and IF pads on the MMICs to the pads on top of wafer 1, and they are connected through via holes to pads on the bottom of the package.

Package A (70) has a socket on one side for input and a plug on the opposite side for output. It has two pads on the bottom: one for DC power, and another for ground. Package B (80) has a socket on one side for RF input, and another socket on the opposite side for LO input. It has pads on the bottom for DC power and ground, and a pad for IF output. The IF output pad has a ground pad on either side. Package C (90) has a plug for RF output, and pads on the bottom for DC power and ground. Package D (100) has a plug for RF output.

Figure 14:
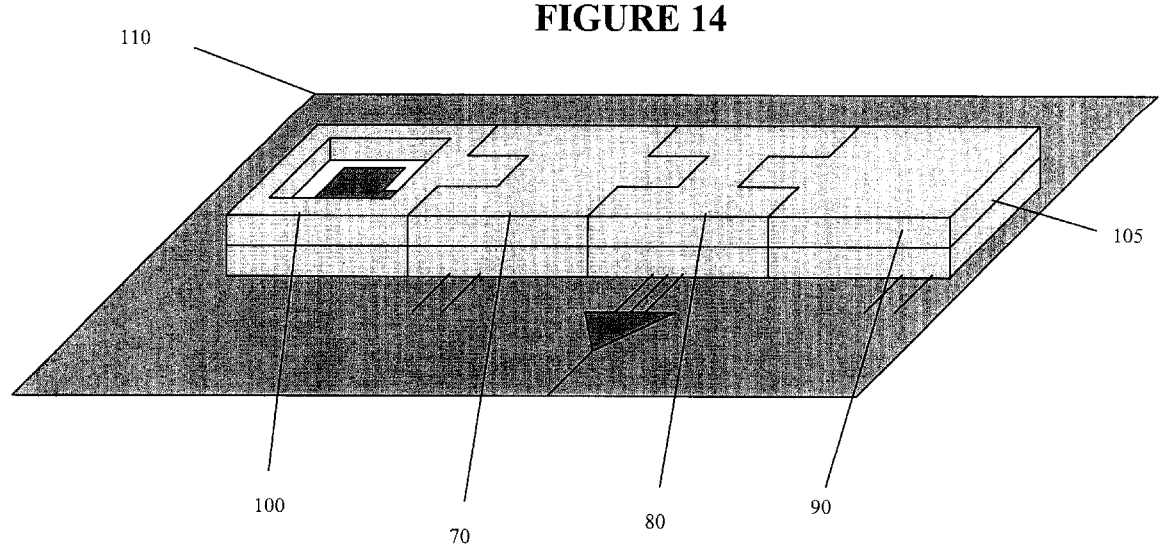
FIG. 14 is an exemplary view of a module formed by the present invention's direct attachment technique mounted on a circuit board.
Figure 15:
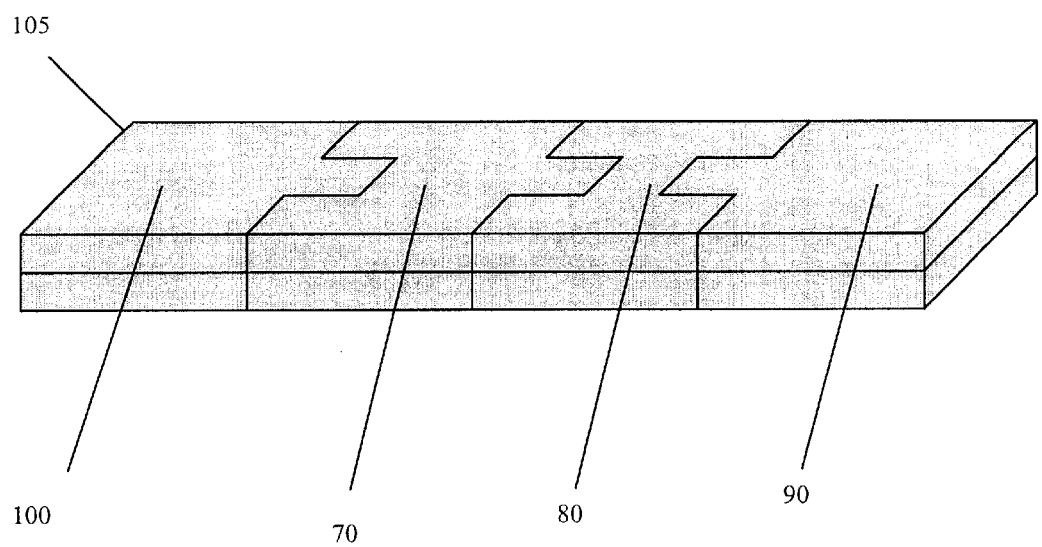
FIG. 15 is an exemplary view of a module formed using the direct attachment technique of the present invention wherein each circuit is fully encapsulated by the package.

Referring to FIGS. 14 and 15, a module assembled using the direct attachment technique of the present invention is illustrated. To assemble the system, the plug of Package D (100) is inserted into the socket of Package A (70). Then, the plug of package A (70) is inserted into the socket for the input on package B (80). The plug of package C (90) is inserted into the socket for a local oscillator (LO) input on package B (80). Thus, the four packages are connected and form a module (105). The module (105) is then surface-mounted onto a circuit board (110), as depicted in FIG. 14, which provides connections to the pads on the bottom of the packages. The circuit board (110) provides power to the packages, and circuitry to perform IF amplification and processing.

What is claimed is:

1. An intercorinectable module for electrically interconnecting high frequency components comprising:

a first planar micromachined package, said first planar micromachined package having a first planar surface and at least one female connection component having a portion integral and coplanar with said first planar surface;

a second planar micromachined package, said second planar micromachined package having a second planar surface and at least one male connection component having a portion integral and coplanar with the second planar surface;

at least one of said micromachined packages having an opening in its corresponding planar surface for housing a high frequency component; and wherein the male connection component of the second planar micromachined package is operably configured to electrically couple with the female connection component of the first planar micromachined package thereby coupling the first planar micromachined package to the second planar micromachined package, such that the first and second planar surfaces are coplanar in the coupled state.

2. The interconnectable module of claim 1, wherein the interconnected modules are surface mounted onto a circuit board.

3. The interconnectable module of claim 1, wherein conductors are patterned on at least one side of the first micromachined package and on at least one side of the second micromachined package, whereby an electrical connection is made between the patterned conductors of the first and second packages when the first and second micromachined packages are coupled together.

4. The interconnectable module of claim 1, wherein the male connection component of said second package is trapezoidal in shape and the female connection component of said first package is shaped as a dovetail like aperture, the trapezoidal shape of said male connection component and the dove-tail like aperture shape of said female connection component enable the first package to be coupled to the second package.

5. The interconnectable module of claim 1, wherein a spring, located on an edge of the first micromachined package and second micromachined package applies a compressive force to one of the first micromachined package and second micromachined package when the first and second micromachined packages arc coupled together.

6. The interconnectable module of claim 1, wherein the first micromachined package has a first and second female connection components and the second micromachined package having a first and second male connection components, the first male connection component having said conductors for carrying the electrical connection whereas the second mate connection component provides alignment when the male connection components slides into a female connection components.

7. The interconnectable module of claim 1 wherein the first and second micromnachincd packages are made of silicon and the component housed in the silicon is an integrated circuit.

8. The intercorinectable module of claim 1, wherein the male connection component of said second micromachined package has at least one vertical edge and the female connection component of said first micromachined package has at least one vertical edge, wherein the vertical edge of said first micromachined package enables said first micromachined package to be coupled to said second micromachined package.

9. The interconnectable module of claim 7, wherein the integrated circuit is a monolithic microwave integrated circuit.

10. The interconnectable module of claim 1, wherein the component housed in the first and second micromachined package of dielectric material is an optical fiber.

11. The interconnectable module of claim 1, wherein the component housed in a first and a second micromachined package of dielectric material is an optical semiconductor.

12. The interconnectable module of claim 7, wherein the integrated circuit housed in the silicon is fully encapsulated in the silicon package.

13. The interconnectable xiiodule of claim 1, wherein the material utilized to fabricate the first and second micromachined packages is silicon.

14. The interconnectable module of claim 1, wherein the dielectric material utilized to fabricate the first and second micromachined packages is a ceramic.

15. The interconnectable module of claim 1, wherein an aperture, operably configured to accept the component, is included on the first and second package of dielectric material.

16. The interconnectable module of claim 1, wherein the first micromachined package further includes at least one male connection component thus enabling multiple packages to be coupled to the first micromachined package.

17. The interconnectable module of claim 16, wherein the first micromachined package houses at least one integrated circuit for each female and male connection component.

18. The interconnectable module of claim 1, wherein the second micromachined package further includes at least one female connection component thus enabling multiple packages to be coupled to the second micromachined package.

19. The interconnectable module of claim 18 wherein, the second micromachined package houses at least one integrated circuit for each female and male connection component.

20. The interconnectable module of claim 1, wherein a first micromachined package of dielectric material has at least one hermaphrodite connection component.

21. The interconnectable module of claim 1, wherein a first and second micromachined package of dielectric material each have at least one hermaphrodite connection component.

22. A method for interlocking packages comprising:
   providing a first planar micromachined package having a first planar surface and at least one female connection component, said female connection component having a portion integral and coplanar with the planar surface;
   providing a second planar micromachined package having a second planar surface and at least one male connection component, said male connection component having a portion integral and coplanar with the second planar surface;;
   forming an opening, in the planar surface of at least one of said micromachined packages, for housing a high frequency component; and coupling the second planar micromachined package to the first planar micromachined package by coupling the male connection component to the final connection component in a common plane thereby creating a functional module for high frequency devices.

23. The method for interlocking packages of claim 22, wherein the component housed in the first and second package is an integrated circuit.

24. The method for interlocking packages of claim 23, wherein the integrated circuit is a monolithic microwave integrated circuit.

25. The method for interlocking packages of claim 22, wherein the component housed in the first and second package is an optical fiber.

26. The method for interlocking packages of claim 22, wherein the component housed in the first and second package is an optical semiconductor component.

27. The method of interlocking packages of claim 22, wherein conductors are located on at least one side of said first and second package wherein an electrical connection is made when said conductors of said second package contact said conductors of said first package when said male connection member of said second package is coupled to said female connection member of said first package.

28. The method of interlocking packages of claim 22, wherein the first and second package are formed from silicon.

29. The method of interlocking packages of claim 22, wherein the first and second package are formed from ceramic.

30. A package having interconnecting capabilities comprising:
   a micromachined planar substrate shaped in a plug formation, said plug having a trapezoidal cross section wherein edges of said trapezoidal cross section are slanted in an inward direction so that a top surface of the plug is broader than a central surface of the plug,;
   a micromachined planar substrate shaped in a socket formation, ihc socket having a dovetail aperture wherein edges of said dovetail aperture are slanted in an inward direction;
   wherein the plug is accepted by the socket thereby locking the two micromachined planar substrates together in a common plane when the edges of the plug are fitted to the inversely slanted edges of the socket.

31. The package having interconnecting capabilities of claim 30, wherein the substrates having a plug and socket formation are made of silicon.

32. The package having interconnecting capabilities of claim 30, wherein the substrate shaped in a plug formation houses an integrated circuit.

33. The package having interconnecting capabilities of claim 30, wherein the substrate shaped in a socket formation house an integrated circuit.

34. The package having interconnecting capabilities of claim 30, wherein the substrate shaped in a plug formation houses an optic fiber.

35. The package having interconnecting capabilities of claim 30, wherein the substrate shaped in a socket formation houses an optic fiber.

36. The package having interconnecting capabilities of claim 30, wherein the substrate shaped in a plug formation houses an optic semiconductor component.

37. The package having interconnecting capabilities of claim 30, wherein the substrate shaped in a socket formation houses an optic semiconductor component.

38. The package having interconnecting capabilities of claim 30, wherein conductors are patterned on both the plug and socket shaped substrates, whereby an electrical connection is made between the conductors of the plug and socket shaped substrates when the plug is accepted by the socket.

39. The package having interconnecting capabilities of claim 38, wherein the conductors are gold.

40. The package having interconnecting capabilities of claim 30, wherein the substrate having a plug formation further includes a first plug for carrying an electrical signal and a second plug for providing guide alignment.

41. The package having interconnecting capabilities of claim 30, wherein the substrate having a socket formation further includes a first socket for accepting the first plug and a second socket for accepting the second plug that provides guide alignment.

42. The package having interconnecting capabilities of claim 30, wherein the substrate having a socket formation further includes a spring, the spring applies a frictional force when the substrate having a plug formation is accepted by the substrate having a socket formation, and thereby assists the coupling of the two substrates.

43. The package having interconnecting capabilities of claim 30, wherein the substrate having a plug formation further includes a spring, the spring applies a frictional force when the substrate having a socket formation is accepts by the substrate having a plug formation, and thereby assists the coupling of the two substrates.

44. An interconnectable module usable with high frequency devices comprising:

a first plan-ar micromachined package for housing a component operable in a millimeter Wave range, said first planar micromachined package having a first planar surface and at least one male connection component having a portion integral and coplanar with said planar surface;

a second planar micromachined package for housing a component operable in a millimeter wave range, said second planar micromachined package having a second planar surface and at least one male connection component having a portion integral and coplanar with the second planar surface; and wherein the male connection component of the second planar micromachined package is operably configured to be electrically connected with the female connection component of the first planar micromachined package thereby coupling the first planar micromachined package to the second planar micromachined package such that the first and second planar surfaces arc coplanar in the coupled state thus providing an efficient way to flansmit signals for high frequency devices.

* * * * *